United States Patent
Furlani et al.

(10) Patent No.: US 7,405,480 B2
(45) Date of Patent: Jul. 29, 2008

(54) ELIMINATION OF THERMAL DEFORMATION IN ELECTRONIC STRUCTURES

(75) Inventors: Edward P. Furlani, Lancaster, NY (US); Richard W. Wien, Pittsford, NY (US); Tabrez Y. Ebrahim, Rochester, NY (US); David L. Patton, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 343 days.

(21) Appl. No.: 11/020,909

(22) Filed: Dec. 22, 2004

(65) Prior Publication Data

US 2006/0132698 A1    Jun. 22, 2006

(51) Int. Cl.
*H01L 23/48*    (2006.01)

(52) U.S. Cl. .......................... 257/750; 257/59

(58) Field of Classification Search .................. 257/59, 257/750
See application file for complete search history.

(56) References Cited

U.S. PATENT DOCUMENTS

| | | | |
|---|---|---|---|
| 5,319,479 A | 6/1994 | Yamada et al. | |
| 6,602,790 B2 * | 8/2003 | Kian et al. | .................. 438/690 |
| 6,678,949 B2 | 1/2004 | Prasad et al. | |

OTHER PUBLICATIONS

U.S. Appl. No. 11/021,132, filed Dec. 22, 2004, Gao.
U.S. Appl. No. 11/022,126, filed Dec. 22, 2004, Gao et al.
U.S. Appl. No. 11/020,910, filed Dec. 22, 2004, Gao et al.

\* cited by examiner

*Primary Examiner*—Douglas M. Menz
(74) *Attorney, Agent, or Firm*—Paul A. Leipold; Andrew J. Anderson

(57) ABSTRACT

A flexible electronic display device is provided comprising a substrate; an imaging layer zone; a transparent superstrate; and a thermal control layer. The device is able to resist thermal deformation caused by the heating generated by the operation of the display.

9 Claims, 10 Drawing Sheets

Geometry and coordinate system for an N-layer thermoelastic analysis

Geometry and coordinate system for an N-layer thermoelastic analysis

ELIMINATION OF THERMAL DEFORMATION IN ELECTRONIC STRUCTURES

FIELD OF THE INVENTION

The present invention is in the field of flexible coated electronic devices and, more particularly, relates to a method of eliminating thermally induced deformations in such a structure.

BACKGROUND OF THE INVENTION

There is substantial and growing interest in the development of flexible electronic circuitry for applications that range from intelligent labels for inventory control, to large format flexible displays. This technology has great potential for many such applications due to the inherent low costs and high throughput of the manufacturing process.

From a structural perspective, flexible electronic circuits are essentially a multilayer stack of thin film laminates. These laminates can range in thickness from a few nanometers, to hundreds of microns. When these structures carry an electrical current, joule heating takes place, and there is a potential for deleterious structural deformation due to the mismatch of thermal expansion coefficients from one layer to the next. The prior art has attempted to address the aforementioned drawbacks and disadvantages, but has achieved mixed results.

For example, in order to redistribute thermal stress, the use of a spacer layer between the thin film and a more rigid layer of a multilayer flexible electronic device has been devised. Although this technique is applied in U.S. Pat. Nos. 6,281,452B1 and 6,678,949 in order to minimize thermal stress, it is nonetheless characterized by drawbacks. This method is generally less than ideal, since it adds unnecessary thickness to a device that is required to be sufficiently thin. Additionally, such thickness restrictions hinder the possibility of employing additional layers that may be needed to minimize thermal stress.

U.S. Pat. No. 5,319,479 discloses a multilayer device, comprised of an electronic element, a plastic substrate, and a thin film, wherein the thermal deformation of the thin film is minimized by plastic substrate and the electronic element. This method has a distinct disadvantage in that it does not provide flexibility in adjusting the coefficient of thermal expansion and the thickness of the respective layers.

PROBLEM TO BE SOLVED BY THE INVENTION

The invention addresses the continuing need for a method to prevent deformation due to thermal heating effects in flexible electronic structures

SUMMARY OF THE INVENTION

In answer to the aforementioned and other problems of the prior art the invention provides a display device comprising: a substrate; an imaging layer zone; a transparent superstrate; and a thermal control layer.

ADVANTAGEOUS EFFECT OF THE INVENTION

The invention provides a comprehensive method of eliminating thermally induced deformation in flexible electronic structures. The method is applicable to multi-layer electronic structures constructed from a variety of flexible materials.

BRIEF DESCRIPTION OF THE DRAWINGS

In the detailed description of the preferred embodiments of the invention presented below, reference is made to the accompanying drawings in which.

DETAILED DESCRIPTION OF THE INVENTION

In the process of utilizing flexible coated electronic devices, deformations are observed when current is applied to these devices, due to differential thermal expansion of the coated layers. The invention teaches a comprehensive approach to solve this problem by the use of a thermal control layer.

A general theoretical model for predicting the thermal deformation in an N-layer laminated structure, expressed in terms of the thicknesses and material properties of the layers in the laminate is provided below.

Figure 1:
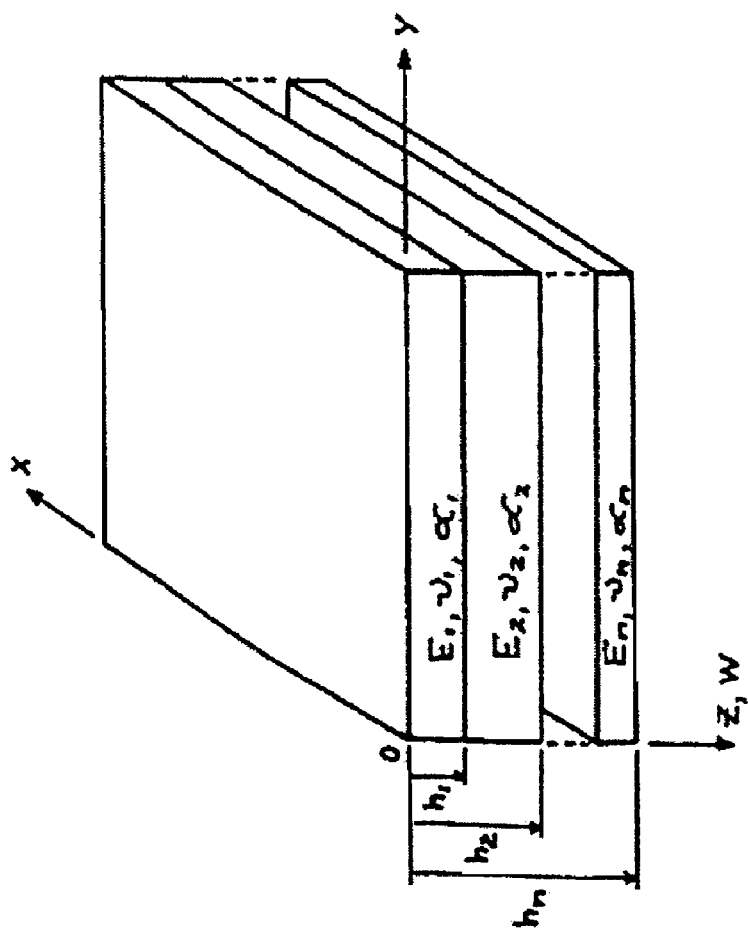
FIG. 1 is a schematic diagram of a generalized laminated multi-layer electronic structure.

The thermoelastic deformation of an N-layer laminated structure shown in FIG. 1 is governed by the following thermoelastic equation:

$$\left(\frac{BD - C^2}{B}\right)\nabla^4 w(x, y) = \nabla^2\left[\frac{C}{B}N_T(x, y) - M_T(x, y)\right] \quad (1)$$

where w(x,y) is the vertical deflection at point (x,y) of the structure, $$\nabla^4 w = \frac{\partial^4 w}{\partial x^4} + 2\frac{\partial^4 w}{\partial y^2 \partial x^2} + \frac{\partial^4 w}{\partial y^4}, \nabla^2 w = \frac{\partial^2 w}{\partial x^2} + \frac{\partial^2 w}{\partial y^2}, \quad (2)$$

and $$N_T(x, y) = \sum_{k=1}^{N} \frac{E_k \alpha_k}{1 - v_k} \int_{h_{k-1}}^{h_k} T_k(x, y) dz \quad (3)$$

-continued $$M_T(x, y) = \sum_{k=1}^{N} \frac{E_k \alpha_k}{1 - v_k} \int_{h_{k-1}}^{h_k} T_k(x, y) z \, dz \quad (4)$$

where $$B = \sum_{k=1}^{N} \frac{E_k}{1 - v_k^2} \left( \frac{h_k - h_{k-1}}{2} \right), \; C = \sum_{k=1}^{N} \frac{E_k}{1 - v_k^2} \left( \frac{h_k^2 - h_{k-1}^2}{2} \right), \quad (5)$$

and $$D = \sum_{k=1}^{N} \frac{E_k}{1 - v_k^2} \left( \frac{h_k^2 - h_{k-1}^2}{2} \right). \quad (6)$$

In these expressions $E_i$, $v_i$, and $\alpha_i$ are the Young's Modulus, Poisson's Ratio, and coefficient of thermal expansion of the i'th layer of the laminated structure, $h_i$ is the distance from the surface of the top layer (z=0) to the bottom of the i'th layer, and $T_i(x,y)$ is the temperature rise at point (x,y) in the i'th layer (FIG. 1).

It follows from Eq. (1) that the source of the thermal deformation is the $$\frac{C}{B} N_T(x, y) - M_T(x, y)$$

term on the right hand side of the equation. One can eliminate any deformation by adjusting $E_i$, $v_i$, $h_i$ and $\alpha_i$ so that $$\frac{C}{B} N_T(x, y) - M_T(x, y) = 0. \quad (7)$$

Use of the application of this general model for predicting thermal deformation in specific flexible electronic multilayer laminates will now be illustrated.

Figure 2:
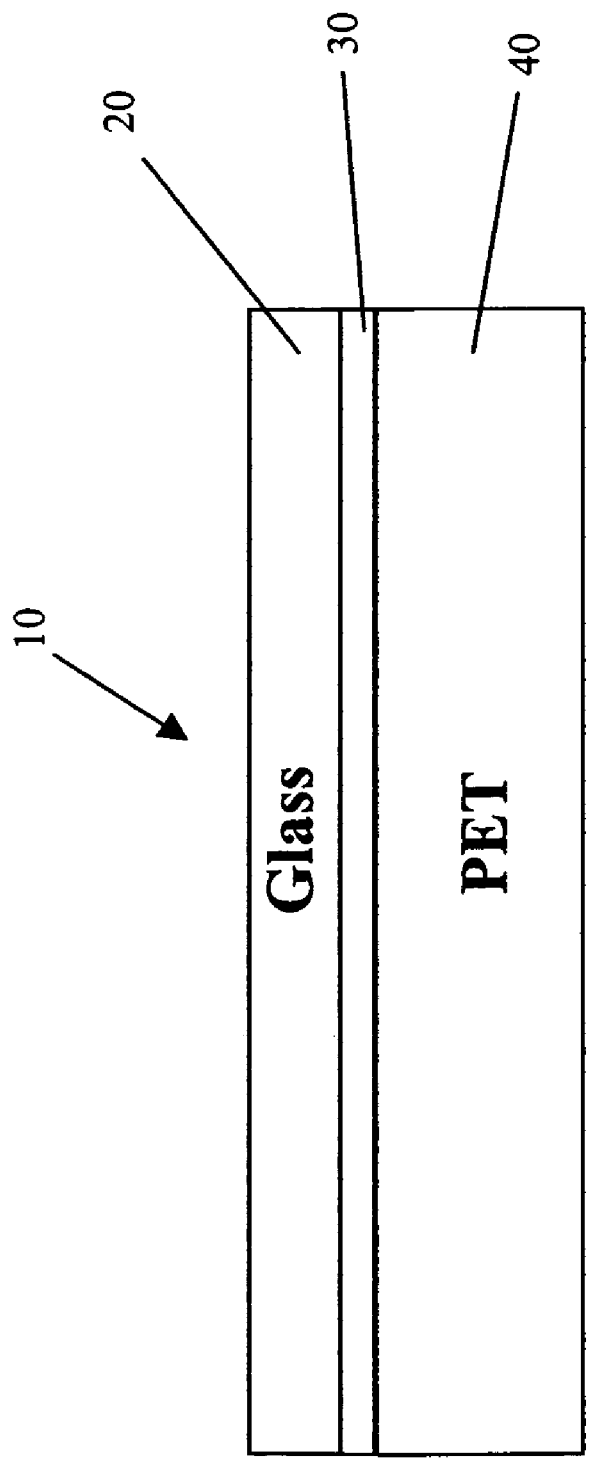
FIG. 2 illustrates a cross-sectional diagram of a simple multi-layer flexible electronic structure.

Referring now to FIG. 2, a simple multi-layer flexible electronic structure 10 is shown. Structure 10 comprises a glass superstrate layer 20, imaging layer zone 30, and substrate layer 40 comprised of polyethylene terphthalate (PET). Imaging layer zone 30 typically comprises a plurality of very thin layers (not shown) and it is in this imaging zone 30 where current passes and where joule heating takes place. However, because the imaging zone 30 is much thinner and much more flexible than either superstrate 20 or substrate 4, the contribution of imaging zone 30 to thermal deformation may be ignored, and structure 10 may be treated essentially as a bilayer with respect to the predictive model of equations 1-7.

Figure 3:
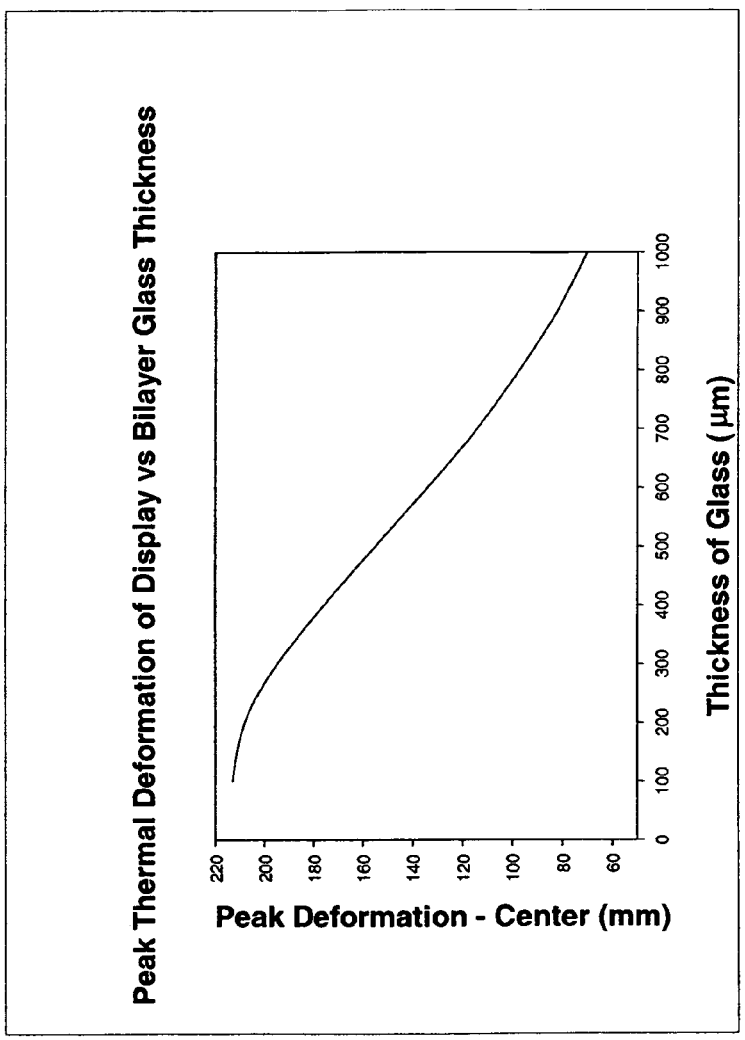
FIG. 3 is a graph showing the thermal deformation predicted for the multi-layer structure of FIG. 2.

According to the aforementioned equations 1-7, the peak thermal deformation of the device 10 can be modeled with respect to the impact of the various layer thicknesses and their material and thermal properties. Continuing with the example of FIG. 2, glass layer 20 has a thickness of 60 μm, a thermal coefficient of expansion of 7×10$^{-6}$/C and a Young's Modulus of 50 GPa. The PET layer 40 has a thermal coefficient of expansion of 80×10$^{-6}$/C, a Young's Modulus of 4 GPa, and a thickness of 1000 μm. As previously mentioned, imaging layer zone 30 is much thinner (typically less than 1 μm) and much more flexible than either layers 20 or 40 and may be ignored. FIG. 3 shows the thermal deformation expected for structure 10 when the thermal deformation model described by equations 1-7 is applied. Referring to FIG. 3, it can be seen that when a structure such as 10 with layer properties and dimensions as described above experiences uniform heating in the imaging zone 30 sufficient to raise the temperature of the device 20 degs C., deformation will be imminent. Furthermore, a structure such as that depicted in FIG. 2, which has essentially only two layers which impact thermal deformation, will experience deformation regardless of thickness variations in the layers. In the results of the model calculations shown in FIG. 3, the thickness of glass layer 20 was continuously varied from 100 to 1000 μm without the value of the peak thermal deformation reaching a value of zero. One way to eliminate thermal deformation in such a device is to introduce an additional thermal balancing layer with appropriate thickness and physical and thermal expansion properties into the structure.

Figure 4:
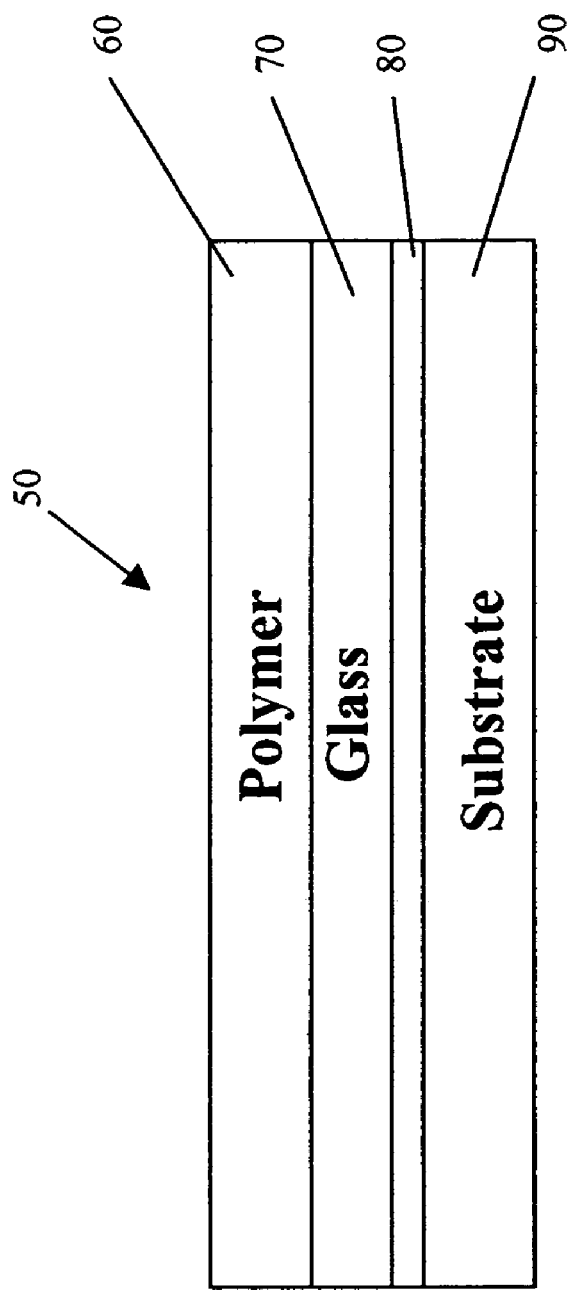
FIG. 4 illustrates a cross-sectional diagram of a multi-layer flexible electronic structure made in accordance with an embodiment of the present invention.

One example of a display structure 50 with such a thermal balancing layer is illustrated in FIG. 4. The layers shown in structure 50 comprise aluminum substrate layer 90, imaging layer zone 80, and transparent superstrate glass layer 70. Transparent superstrate glass layer 70 may also serve as an oxygen and moisture diffusion barrier in certain types of display devices. A thermal control layer 60 comprised of PET polymer has been incorporated on top of layer 70.

In the example modeled, for a display of overall dimensions 1 meter×0.5 meter the aluminum substrate layer 90 has a thickness of 500 μm, a thermal coefficient of expansion of 23×10$^{-6}$/C and a Young's Modulus of 70 GPa. The glass layer 70 has a thickness of 60 μm, a thermal coefficient of expansion of 7×10$^{-6}$/C, and a Young's Modulus of 50 GPa. The polymer superstrate PET layer 60 has a thermal coefficient of expansion of 70×10$^{-6}$/C and a Young's Modulus of 4 GPa. As in the previous example of FIG. 2, imaging zone 80 is comprised of layers which are much thinner and more flexible than the aforementioned layers and contain light-emissive or light modulating components and/or electronic control layers. Again, as in the previous example, the layers in the imaging zone 80 do not control thermal deformation in the overall device, but instead it is the behavior of the layers 60, 70, 90 illustrated which, when heated, control this deformation. For the purposes of this example, it is again assumed that the device experiences an overall temperature increase of 20 deg C. at equilibrium when operated.

Figure 5:
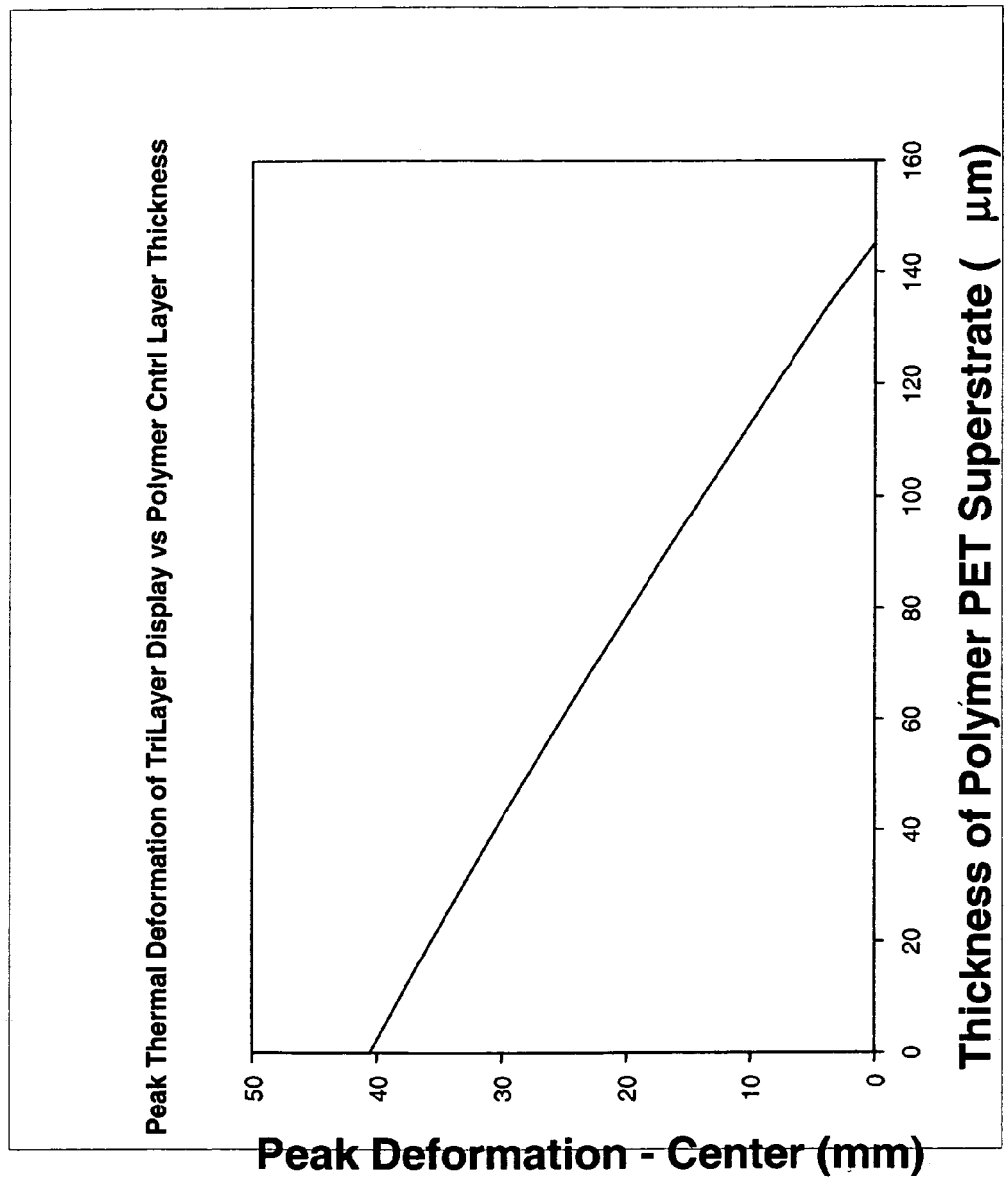
FIG. 5 is a graph showing the thermal deformation predicted for the electronic structure of FIG. 4.

For this example, the effect of varying the thickness of the PET polymer layer 60 was modeled in accord with equations 1-7. FIG. 5 shows the results of the model calculations and it can be seen that a laminated structure 50 with a PET layer 60 of approximately 145 μm thickness will experience zero peak deformation.

Alternative materials would also be expected to be useful in a display structure such as structure 50. In addition to aluminum, substrate layer 90 may also comprise aluminum alloy, anodized aluminum, stainless steel, titanium, molybdenum, or copper. In addition to glass, transparent superstrate layer 70 may also comprise crystalline inorganic oxides such as quartz, polyolefin, polymer-inorganic composites or barrier layers such as Vitex™. Alternatively, transparent superstrate layer 70 may also contain particulate or other optical scattering materials such as titanium dioxide to improve light yield from the display device. Balancing layer 60 may comprise any of a number of film-forming polymeric materials with appropriate properties including polycarbonate or polyolefin materials and their derivatives.

Imaging layers contained in imaging layer zone 80 which would be useful in flexible electronic display devices include, for example, the layers required for an organic light emitting diode (OLED) display device. Typically the imaging layers in an OLED display comprise (in order) a transparent cathode, an electron injection layer, an emitter layer, a hole injection layer, and a transparent anode. Electrical current is applied to the anode and cathode. The current flows in the form of holes from the anode and electrons in the cathode. The holes and electrons subsequently meet and recombine in the emitter layer causing the emission of photons (light). For a typical passive matrix OLED display the anode and cathode layers may also be patterned in orthogonal arrays to form pixels, while in active-matrix displays each pixel is controlled independently, for example, with thin film transistors (TFTs).

Other examples of layers useful expected to be useful in imaging layer zone 80 include the layers that would be associated with a flexible liquid crystal display (LCD). Typically, the imaging layers in an LCD display comprise (in order) a light polarizing layer, a transparent anode, a liquid crystal layer, a transparent cathode, and another light polarizing layer. When electrical current is applied to the electrodes, the liquid crystal layer changes state and prevents light from passing out of the display. As described for the OLED display above, the anode and cathode will typically be patterned to form pixels and both active and passive matrix architectures may be used.

A flexible cholesteric LCD display would have layers very similar to the layers required for an LCD display described above, with the exception that the liquid crystal layer comprises a liquid crystal material in the cholesteric phase. This cholesteric liquid crystal layer changes state when current is applied to the electrodes, but remains in the changed state when the current is turned off.

Figure 6:
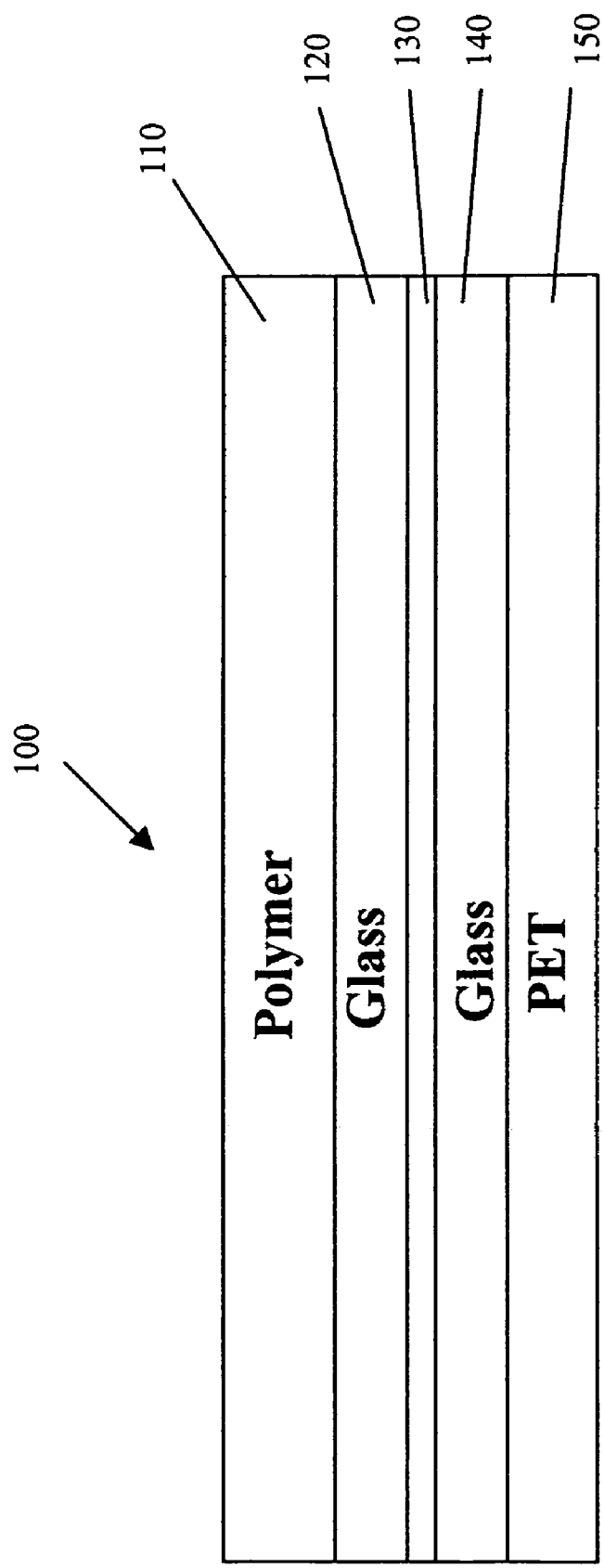
FIG. 6 illustrates a cross-sectional diagram of a multi-layer flexible electronic structure made in accordance with an embodiment of the present invention.
Figure 7:
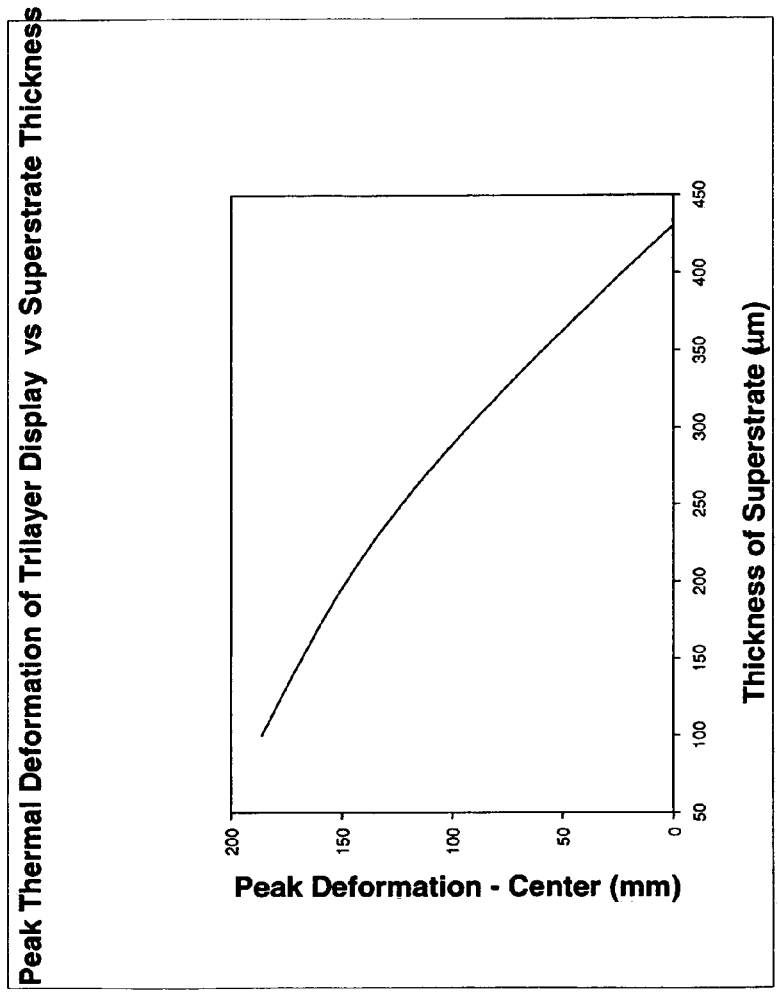
FIG. 7 is a graph showing the thermal deformation predicted for the electronic structure of FIG. 6.

Additionally, the model of equations 1-7 can be used to predict the thermal deformation behavior of other display structures and to design improved structures where thermal deformation is reduced or eliminated. Another example of a multilayer, flexible electronic structure is shown in FIG. 6. The device 100 comprises a polymer thermal control layer 110, glass layers 120 and 140, imaging layer zone 130, and PET substrate layer 150. Again, as in the previous examples given, because of thickness and flexibility considerations, the imaging layer zone 130 does not contribute significantly to thermal deformation, and the device 100 may be treated essentially as a trilayer. As before, the thermal properties and thickness of the polymer thermal control layer 110 can selected to minimize thermal deformation. FIG. 7 shows the results of modeling, according to equations 1-7, the thermal deformation behavior of device 100 where the overall dimensions of the display are 1 meter×0.5 meters with a polymer substrate 150 of TCE=80×10$^{-6}$/C and E=4 GPa and glass midsections 120 and 140 of TCE=7×10$^{-6}$/C and E=2.4 GPa and polymer thermal control layer 110 of TCE=200×10$^{-6}$/C and E=4 GPa with a temperature change of 20 deg C. . It can be seen from the data in FIG. 7, that a polymer thermal control layer 110 of approximately 430 μm and a hypothetical thermal coefficient of expansion (TCE) of 200×10$^{-6}$/C will control the thermal deformation of the device to essentially zero.

Figure 8:
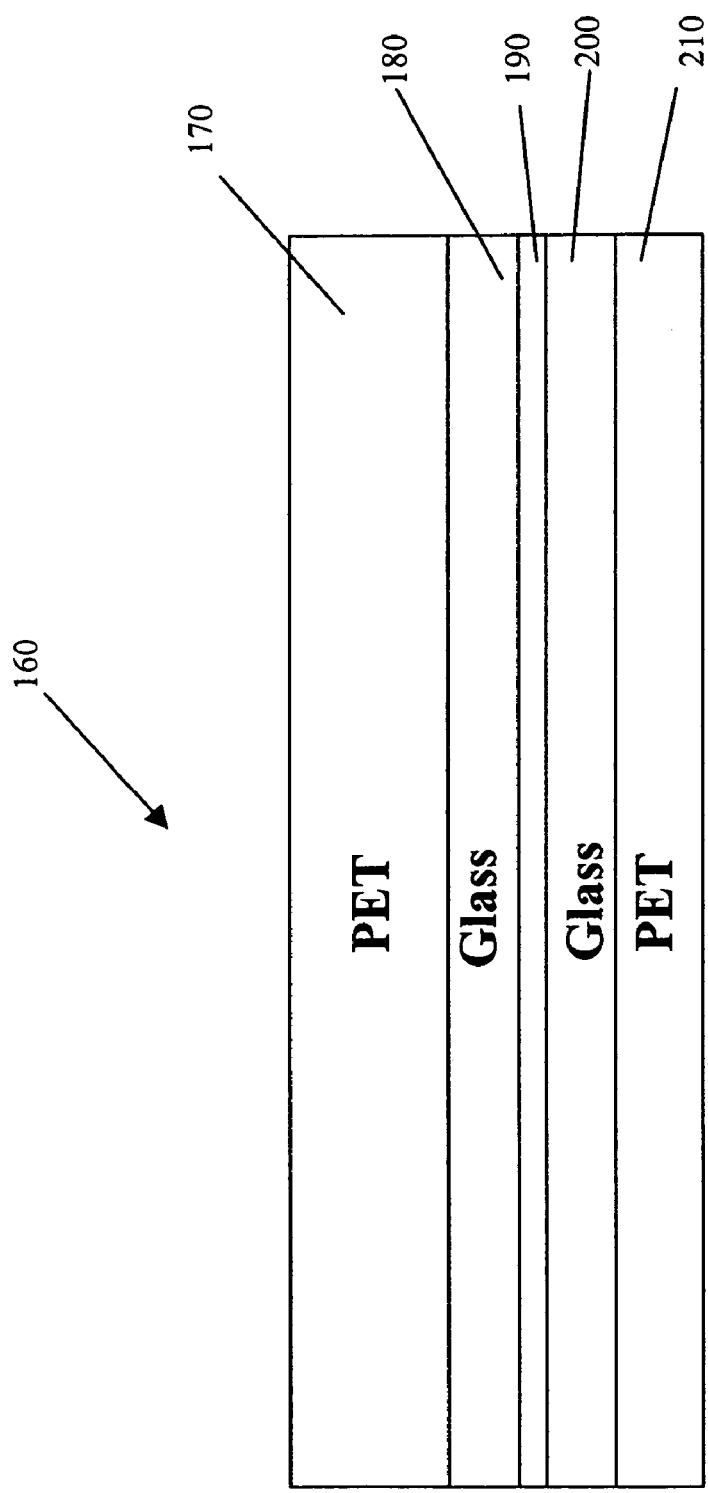
FIG. 8 illustrates a cross-sectional diagram of a multi-layer flexible electronic structure made in accordance with yet an embodiment of the present invention.
Figure 9:
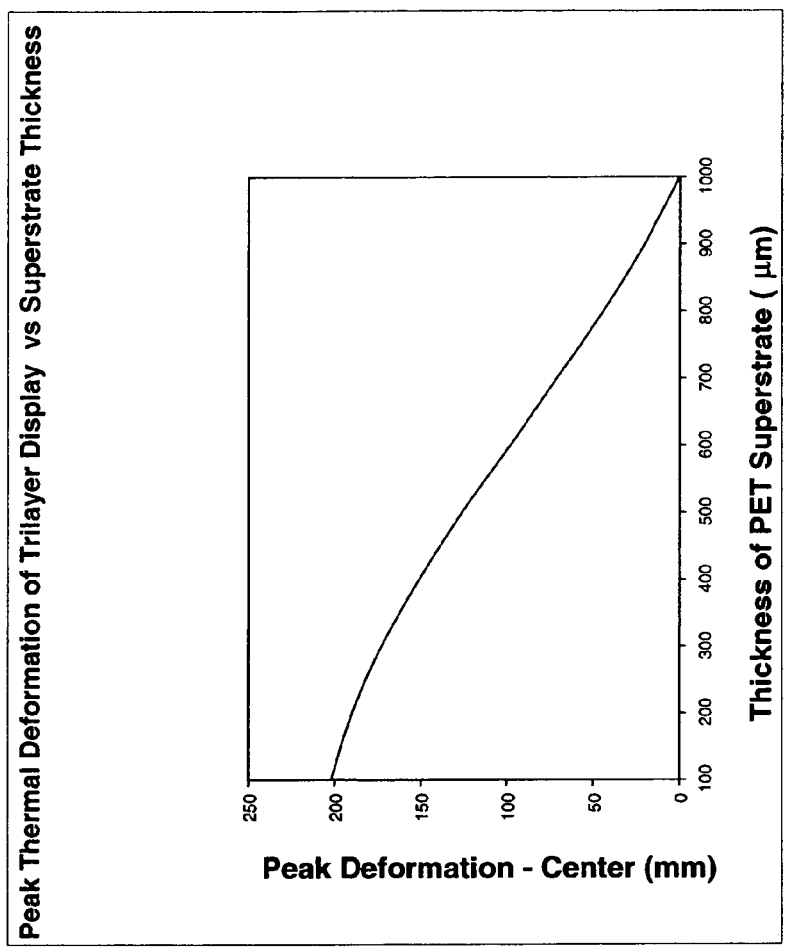
FIG. 9 is a graph showing the thermal deformation predicted for the electronic structure of FIG. 8.

In FIG. 8, still another example of a multilayer, flexible electronic structure is provided. The device 160 of dimensions 1 meter×0.5 meter subjected to a temperature change of 20 deg C., is comprised of a polymer PET thermal control layer 170 with TCE=80×10$^{-6}$/C and E=4 GPa, glass layers 180 and 200 with TCE=7×10$^{6}$/C and E=2.4 GPa, imaging layer zone 190, and PET substrate layer 210 with TCE=80×10$^{-6}$/C and E=4 GPa. FIG. 9 shows the results of modeling the thermal deformation behavior of device 160 under the temperature, layer material type, and layer property conditions as described above. Structure 160 experiences zero peak deformation when the PET thermal control layer 170 has a thickness of approximately 1000 μm as can be seen in FIG. 9. Thus, employing polymer superstrate 210 with a lower TCE of 80×10$^{-6}$/C requires a greater superstrate thickness of 1000 μm, as seen in FIG. 9, than with employing polymer superstrate 110 with a higher TCE of 200×10$^{-6}$/C which requires a lower thickness of 430 μm, as seen in FIG. 7.

Figure 10:
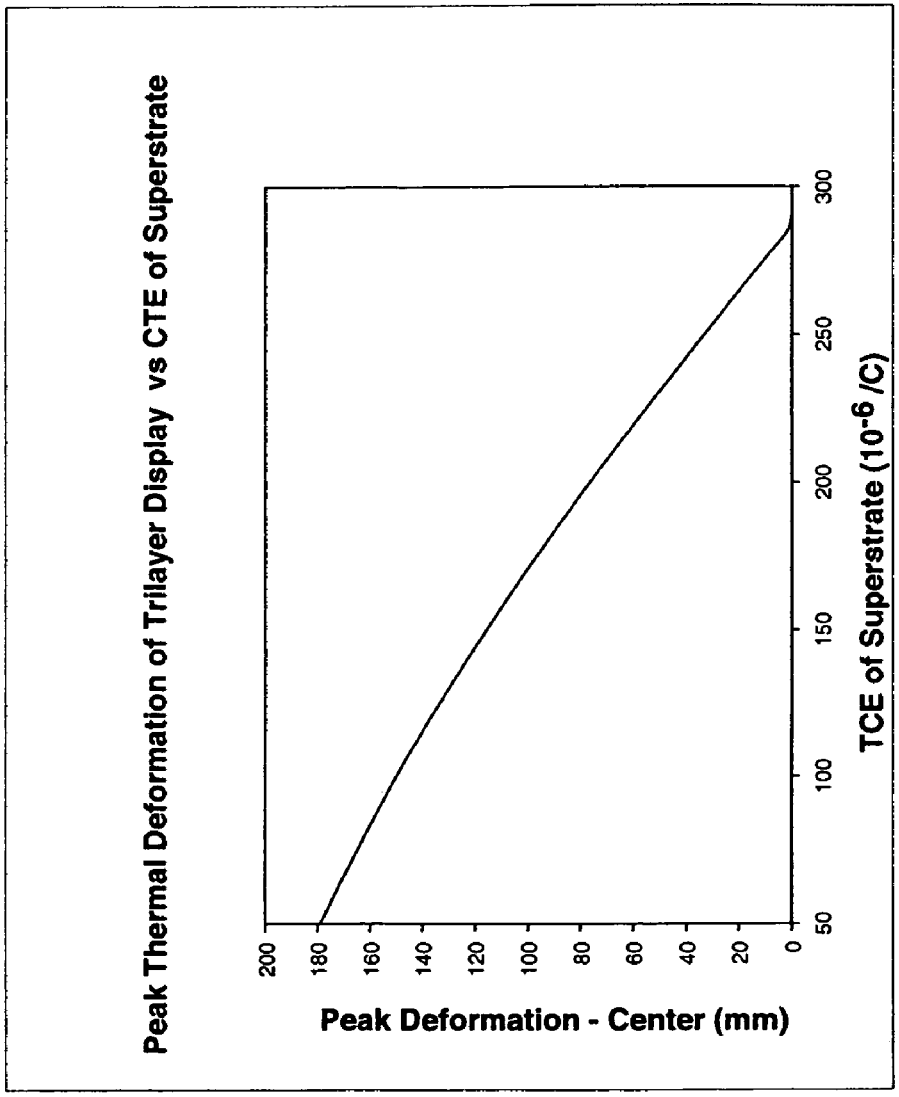
FIG. 10 is a graph showing the effect of varying the coefficient of thermal expansion of the control layer in the electronic structure of FIG. 8.

The aforementioned theoretical model of equations 1-7 can also be used to predict the peak thermal deformation of a flexible display device based on an assumed or required thermal control layer thickness. This allows the thermal coefficient of expansion to be computed, which can, in turn, be used to determine a different polymer material. The results for modeling the thermal deformation in a device 160 where the polymer thermal control layer 170 is constrained to be 300 μm are shown in FIG. 10 (same layer dimensions and properties as described for FIG. 9 except that the TCE for the thermal control layer 170 is allowed to change Under this constraint, the results in FIG. 10 show that thermal deformation is minimized when a control layer material of TCE=285×10$^{-6}$/C is selected.

The invention has been described in detail with particular reference to certain preferred embodiments thereof, but it will be understood that variations and modifications can be effected within the scope of the invention.

What is claimed is:

1. A flexible electronic display device comprising:
   a. a substrate;
   b. an imaging layer zone;
   c. a transparent superstrate; and
   d. a thermal control layer, wherein the thermal control layer has appropriate thickness and physical and thermal expansion properties such that said device is flat over a 20° C. temperature variation.

2. The device of claim 1 wherein the thermal control layer is transparent.

3. The device of claim 1 wherein said thermal control layer comprises polyester.

4. The device of claim 1 wherein said image imaging layer zone comprises organic light emitting diode (OLED) or liquid crystal display (LCD).

5. The device of claim 1 wherein said imaging layer zone comprises an electronic control layer.

6. The device of claim 1 wherein said substrate comprises a metallic layer.

7. The device of claim 1 wherein said substrate comprises polyethylene terephthalate(PET).

8. The device of claim 1 wherein layer a, b, c, and d are laminated together.

9. The device of claim 1 wherein said device further comprises a protective layer over said thermal control layer.

* * * * *